(12) United States Patent
Morohoshi et al.

(10) Patent No.: US 6,563,573 B1
(45) Date of Patent: May 13, 2003

(54) METHOD OF EVALUATING IMAGING PERFORMANCE

(75) Inventors: Hiroshi Morohoshi, Utsunomiya (JP); Hideki Ina, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/394,416

(22) Filed: Sep. 13, 1999

(30) Foreign Application Priority Data

Sep. 14, 1998 (JP) .......................................... 10-279435

(51) Int. Cl.$^7$ ................................................. G01B 9/00
(52) U.S. Cl. ....................................... 356/124; 356/401
(58) Field of Search ....................... 430/22, 30; 356/124

(56) References Cited

U.S. PATENT DOCUMENTS

| | | | |
|---|---|---|---|
| 4,886,974 A | 12/1989 | Ina ............................... | 250/561 |
| 4,901,109 A | 2/1990 | Mitome et al. ................ | 355/68 |
| 5,615,006 A | * 3/1997 | Hirukawa et al. ........... | 356/124 |
| 5,659,384 A | 8/1997 | Ina ............................... | 355/53 |
| 5,760,879 A | 6/1998 | Shinonaga et al. ............ | 355/55 |
| 6,130,747 A | * 10/2000 | Nomura et al. .......... | 356/239.2 |

FOREIGN PATENT DOCUMENTS

JP          9-280816          10/1997

* cited by examiner

*Primary Examiner*—Frank G. Font
*Assistant Examiner*—Andrew H. Lee
(74) *Attorney, Agent, or Firm*—Fitzpatrick, Cella, Harper & Scinto

(57) ABSTRACT

A method of evaluating an imaging performance of an imaging optical system includes providing a member having a measurement mark with a predetermined surface level difference, illuminating the member having the measurement mark through the imaging optical system, and receiving reflection light from the illuminated measurement mark again through the imaging optical system. A detection signal is produced based on the measurement mark, illuminated through the imaging optical system, wherein the detection signal is produced while changing a focus within a depth of focus of the imaging optical system. A positional deviation is measured on the basis of the detection signal, and the imaging performance is evaluated of the imaging optical system on the basis of a change in a measured value of the positional deviation measurement with respect to a change in the focus.

9 Claims, 8 Drawing Sheets

METHOD OF EVALUATING IMAGING PERFORMANCE

FIELD OF THE INVENTION AND RELATED ART

This invention relates to a method of evaluating the imaging performance of an imaging optical system. More particularly, the invention is concerned with an imaging performance evaluating method for use in performance inspection of an imaging optical system in a registration inspecting apparatus, for example, which is useable for inspection of an optical performance such as distortion or alignment precision, of a projection optical system in a semiconductor device manufacturing exposure apparatus of step-and-repeat type or step-and-scan type, for example.

In projection exposure apparatuses for the manufacture of semiconductor devices, a performance for printing, through projection exposure, a circuit pattern of a reticle onto a wafer with high resolution is required to meet further increases in density of an integrated circuit. In an attempt to improve the resolving power for the projection of a circle pattern, a method in which the numerical aperture (NA) of a projection optical system is enlarged while keeping the wavelength of exposure light fixed, a method of shortening the wavelength of exposure light (e.g., changing from g-line to i-line, from i-line to the emission wavelength of an excimer laser or to that of an $F_2$ laser, or a method using SOR light), have been proposed and developed.

On the other hand, in the stream of further miniaturization of a circuit pattern, a performance for aligning a wafer and a reticle having an electronic circuit pattern formed thereon very precisely, is also required. Generally, the required alignment precision is about one-third or less of the linewidth of a circuit pattern. For a 1G bit DRAM, for example, if the circuit pattern is based on 0.18 micron rule, an overlay precision (alignment through the whole exposure region) of 60 nm or less is required.

Further, in a registration inspecting apparatus wherein this overlay precision is measured, a precision of about one-tenth of the overlay precision is required. For a 1G bit DRAM, a precision of 6 nm or less is necessary.

For higher precision measurement in such registration inspecting apparatuses, a method called a TIS (Tool Induced Shift) correction method wherein the influence of TIS, which is a detecting system factor among the measurement error producing factors, is reduced, has been proposed and developed.

FIG. 1A is a schematic view for explaining this TIS correction method. FIG. 1A shows an example wherein a surface step (difference in level) is defined on a silicon wafer 1 by an etching process, and wherein the relationship between an etching pattern (first mark) 2 based on the level difference and a resist image pattern (second mark) 3 having been printed and developed after the alignment process is going to be measured. In accordance with the TIS correction method, the measurement is made twice. Here, the second time measurement is performed while rotating the wafer 1 by 180 degrees as compared with the first time measurement. The result of such a first time measurement is called "0-deg. measured value" ($\Delta_{0\text{-}deg}$), and the result of a second time measurement is called "180-deg. measured value" ($\Delta_{180\text{-}deg}$). In the TIS correction method, a value obtainable by dividing, by 2, the difference of a 0-deg. measured value minus a 180-deg. measured value, is used as a measured value. On the basis of this, an error in the detection system factor is reduced, whereby high precision measurement can be accomplished. Here, the value obtainable by dividing, by 2, the sum of the 0-deg. measured value plus the 180-deg. measured value, is called "TIS".

Use of such a TIS correction method will be effective to reduce the measurement error of the detection system factor. However, it is still insufficient. For example, even if one and the same wafer is measured in accordance with the TIS correction method by using two different measuring machines, there may occur a large difference, as shown in FIG. 1B. As regards this alignment precision, since the alignment sequence of the exposure apparatus is based on the global alignment method, it does not become worse beyond "root 2" times the precision of a stage system of the exposure apparatus, having an interferometer and for driving the wafer.

The result of the measurement by the registration inspecting apparatus #2 of FIG. 1B is, however, worse by much more than "root 2" times the precision of the stage system for driving the wafer and having an interferometer. Thus, clearly, it is attributable to a factor in the registration inspecting apparatus.

This results from the TIS-WIS interaction on an occasion when there is a WIS (Wafer Induced Shift), which is a wafer factor among the measurement error producing factors. In this example, the insufficiency of the result based on the TIS correction is clearly seen in FIG. 1B. New semiconductor processes such as a Cu-CMP process, for example, will be introduced successively and, in those cases, there will still be WIS present. In consideration of this, for improvement in precision of a registration inspecting apparatus, it is desirable that the TIS be removed as much as possible to thereby prevent the TIS-WIS interaction.

In the TIS correction method, the measurement has to be done twice, at 0 degree and 180 degree. This is a large problem in relation to the throughput. In current mass-production of semiconductor devices, therefore, the TIS correction method is not used prevalently.

As regards removal of TIS, the cause of production of TIS due to an optical factor as well as conventional examples therefor will be described. Most of currently used registration inspecting apparatuses or alignment detecting systems are based on a bright-field image processing process.

FIG. 2 is a schematic view of an example of a registration inspecting apparatus. In this example, a special mark (first and second marks 2 and 3) is provided on a wafer 1, and an image of the mark is formed through an optical system upon an image pickup device such as a CCD, for example. An electric signal therefrom is processed, by which the positions of the first and second marks 2 and 3 are detected. The imaging performance which is most necessary in this optical system is the symmetry of images corresponding to the first and second marks 2 and 3. If there is something in the optical system (imaging optical system) that deteriorates the image symmetry, it means that there is TIS present.

In these types of alignment detecting systems, the magnification is made high (e.g., about 100x) and, in most cases, it is used on or in the proximity of the axis. For this reason, the major cause for deterioration of symmetry of the mark image is not an off-axis aberration but an eccentric coma aberration close to the axis of the optical system and the non-uniformness in an illumination system.

Further, it has been found that the symmetry of a mark image changes with the amount of surface level difference (height of a surface-step) upon a wafer to be measured.

FIG. 1C is a schematic view for explaining a first mark 2 and a second mark 3 formed on the wafer 1 of FIG. 2, and it illustrates the manner of calculating the symmetry SOI (Symmetry of Image) to be produced by a signal (waveform intensity) which is based on the first and second marks 2 and 3.

When the waveform intensities at the opposite ends 2a and 2b of the first mark 2 are denoted by a and b, respectively, and when the waveform intensity based on the wafer top surface is denoted by c, the symmetry SOI can be determined in accordance with:

$$SOI=100(a-b)/c.$$

FIG. 1D shows the results of the symmetry SOI of the optical image as defined with reference to FIG. 1C, which were obtained experimentally while changing the amount of surface level difference SH. In the experiments, the symmetry SOI of the image was measured while taking the eccentric coma aberration of the optical system as $\lambda/4$ and $-\lambda/20$ (where $\lambda$ is the illumination wavelength).

As seen from FIG. 1D, the symmetry SOI of the optical image changes relative to the surface level difference SH in accordance with a sine function of the period $\lambda/2$ (where $\lambda$ is the illumination wavelength), and the amplitude thereof is dependent upon the coma aberration of the optical system. Further, it has been found that, in relation to the non-uniformness of the illumination system, too, the symmetry changes in accordance with a sine function of the same period, and that the amplitude is dependent upon the non-uniformness of the illumination system. Furthermore, this phenomenon has been confirmed not only by experiments but also by simulations or analyses based on models.

When the measurement is made on the basis of reflection, as shown in FIG. 1D, the asymmetry of the optical image becomes largest with a surface level difference corresponding to a multiple of $1/8$ of the illumination wavelength $\lambda$ by an odd number, that is, $\lambda/8$ or $3\lambda/8$, for example. On the other hand, with a surface level difference corresponding to a multiple of $1/8$ of the illumination wavelength by an even number, that is, $2\lambda/8$ or $4\lambda/8$, for example, the symmetry of the optical image can be held independently of the coma aberration or non-uniformness of the illumination system. In other words, there are a surface level difference which is sensitive to the coma aberration or non-uniformness of the illumination system and a surface level difference which is not sensitive to them.

In consideration of the above, an evaluation method which uses such a sensitive surface level difference, for high precision evaluation of the coma aberration of an optical system and non-uniformness of the illumination system, has been proposed in Japanese Laid-Open Patent Application, Laid-Open No. 9-280816, filed by the assignee of the subject application.

Here, this evaluation method will be called a "two-mark interval measurement method $TIS_2$". FIG. 1E illustrates the same. As the surface level difference of these two marks D1 and D2, values of $\lambda_c/8$ and $3\lambda_c/8$ (or multiples of them) are used. While the foregoing description has been made with reference to monochromatic illumination light $\lambda$ having no illumination wavelength bandwidth, in the discussion below, the description will be made with reference to the use of illumination light having a certain bandwidth. Thus, $\lambda_c$ denotes the center wavelength of the illumination light to be used in an alignment optical system and having a certain bandwidth.

The amounts of surface level differences $\lambda_c/8$ and $3\lambda_c/8$ are those values both of which reflect the coma aberration of the optical system and non-uniformness of the illumination system, sensitively. The asymmetry of them lies in opposite directions, and also the influence of it to the measured value, in the marks D1 and D2 (values of the marks D1 and D2 are positive), is produced in the opposite directions, as shown in FIG. 1E.

Since the orientation of the marks D1 and D2 is unchanged with the rotation of the wafer by 180 degrees, a half of the difference between the measured values at the 0-deg. and the 180-deg. corresponds to the sum $TIS_2$ of the marks D1 and D2. Thus, the measurement can be done with double sensitivity, as compared with a case where only one surface level difference is used.

Next, the results of practical application of this evaluation method will be described. First, the two-mark interval measurement $TIS_2$, which is the item of evaluation, was applied to an alignment optical system for use in an alignment process in a semiconductor device manufacturing exposure apparatus, which optical system is substantially equivalent to the optical system shown in FIG. 2, and investigations were made with respect to the correspondence of it. FIGS. 1F and 1G show the relation with respect to the two-mark interval measurement $TIS_2$, with a portion of the alignment optical system being changed to change the eccentric coma aberration and non-uniformness of the illumination system.

In both of FIGS. 1F and 1G, it is seen that both have a correlation with $TIS_2$. The evaluation method based on two-mark interval measurement needs the use of two surface level differences which are sensitive and which have asymmetry in opposite directions. While it depends on the size of the mark, if the two surface level differences are not covered by the measurement range simultaneously, the measurement has to be done in cooperation with motion in the measurement direction. As described hereinbefore, the surface level differences of the marks to be used in the two-mark interval measurement $TIS_2$, those corresponding to $1/8$ and $3/8$ with respect to the center wavelength $\lambda_c$ of the illumination light to be used in the alignment optical system, that is $\lambda_c/8$ and $3\lambda_c/8$, are used.

Although there is an effect obtainable with the use of these surface level differences, in an exact sense, taking it with reference to the center wavelength $\lambda_c$ of the illumination light is still insufficient. In a registration inspecting apparatus for which a precision of one-tenth or less of the overlay precision is required, an evaluation criterion should be prepared while taking into account any other variables.

SUMMARY OF THE INVENTION

It is an object of the present invention to provide an evaluation method by which an imaging performance of an imaging optical system can be evaluated, with a high sensitivity.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

In an embodiment of the present invention to be described below, the imaging performance of an imaging optical system is evaluated in accordance with an evaluation method of the present invention, and the TIS is removed through adjustment of the optical system. Based on this, the TIS in a registration inspecting apparatus can be removed or reduced as much as possible, whereby the TIS-WIS interaction can be avoided. This fully meets the requirement of high precision alignment.

As the TIS is removed, the value based on the TIS correction and the 0-deg. measured value become equal to each other. Therefore, use of the TIS correction method becomes unnecessary, and only a single measurement of 0-deg. measurement is necessary. This is an effective solution to the problem of throughput.

Further, a method that does not need two silicon etching surface step marks (first and second marks) or driving precision as required in the two-mark interval measurement method $TIS_2$, will be proposed. Moreover, for higher precision detection as required for a registration inspecting apparatus, an evaluation criterion with many variables being taken into account, will be proposed.

An evaluation method to be described below is a method by which the above-described problem or problems can be solved. Since it takes a TIS value when the focus is changed, as an evaluation value, it will be called here a "TIS-through-Focus method". In such a TIS-through-Focus method, in order to accomplish evaluation of an optical system with highest sensitivity, a silicon wafer (first mark) used plus a resist pattern (second mark) may be set to a surface level difference which is exactly most sensitive to the coma aberration (including eccentric uniformness of an illumination optical system), while many variables are taken into account.

The surface level difference such as above may be determined in consideration of the spectral reflection factor of a silicon wafer and a resist pattern, the spectrum-to-photoelectric conversion efficiency of a photoelectric converting device, the spectral transmission factor of an optical system, or the intensity distribution of illumination wavelength, within the wavelength region used for the illumination. A surface level difference with which an asymmetry curve shows a peak (the asymmetry curve showing that the asymmetry of an optical image changes with a change in the surface level difference) may be used. For both of the silicon wafer (optical member) and the resist pattern (first and second marks), a surface level difference corresponding to the peak of the asymmetry curve may be used. More specifically, the silicon wafer and the resist pattern may have steps of those surface level differences corresponding to peaks in opposite asymmetry directions. There, the focus may be changed and a TIS value may be taken, whereby evaluation of an optical system with a high sensitivity can be accomplished.

Figure 1A:
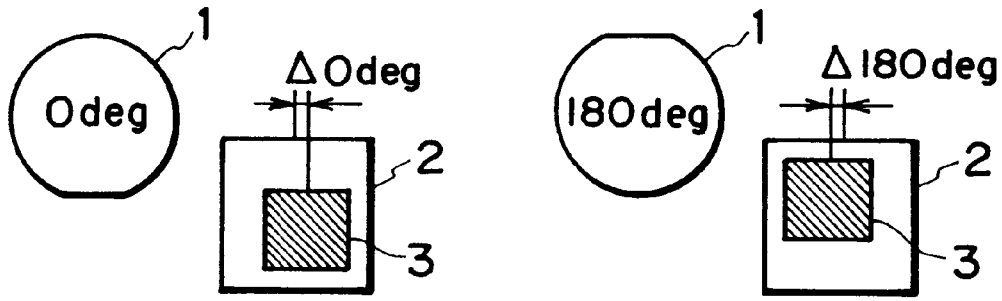
FIG. 1A is a schematic view for explaining a TIS correction method.
Figure 1B:
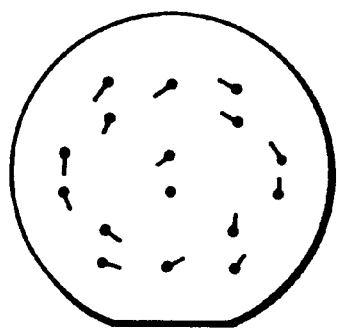
FIG. 1B is a schematic view for explaining the results of measurements made to one and the same wafer by use of first and second registration inspecting apparatuses, the results containing a large difference due to the TIS-WIS inspection.
Figure 1B:
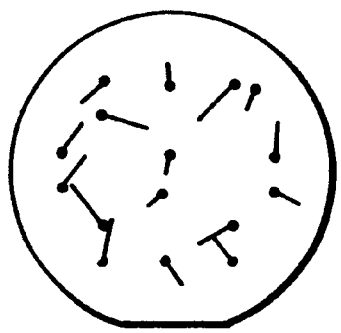
Figure 1C:
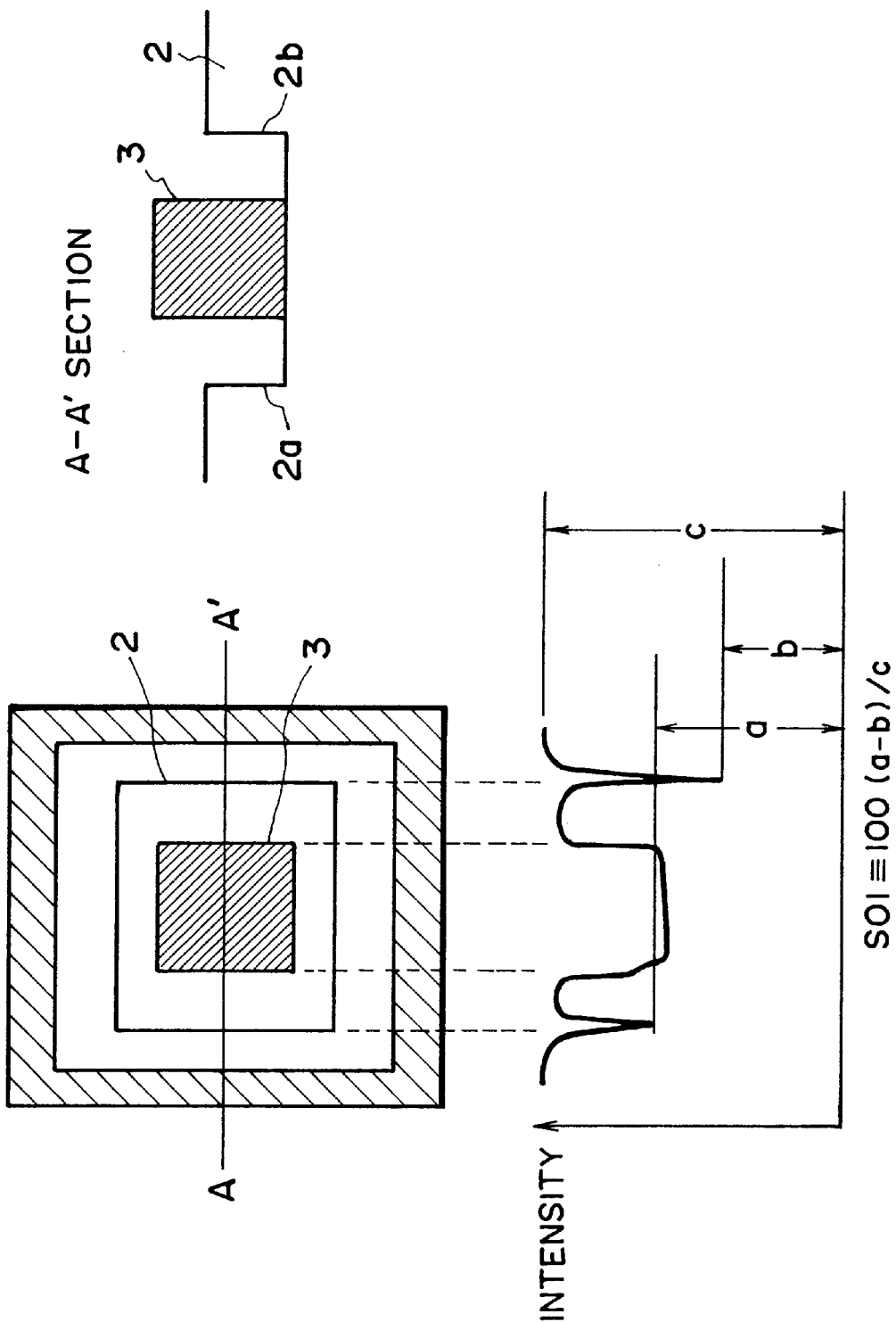
FIG. 1C is a schematic view for explaining a portion of an inspecting apparatus.
Figure 1D:
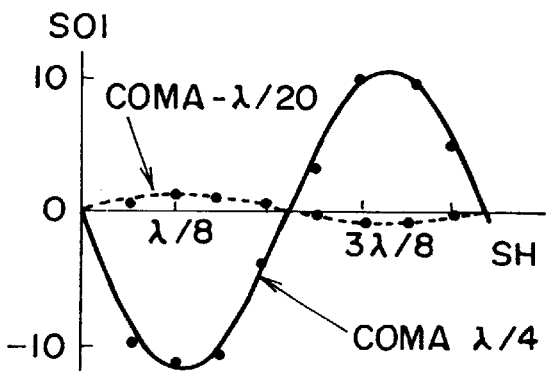
FIG. 1D is a graph for explaining changes in the symmetry of image with the amount of surface level difference on the wafer surface, in a case where a registration inspecting apparatus has an eccentric coma aberration.
Figure 1E:
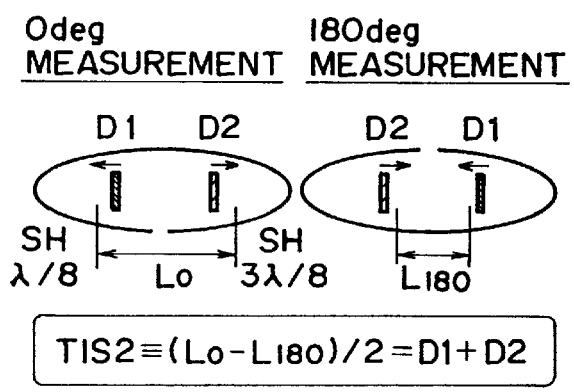
FIG. 1E is a schematic view for explaining a two-mark interval measurement method $TIS_2$ in an evaluation method having already been proposed.
Figure 1F:
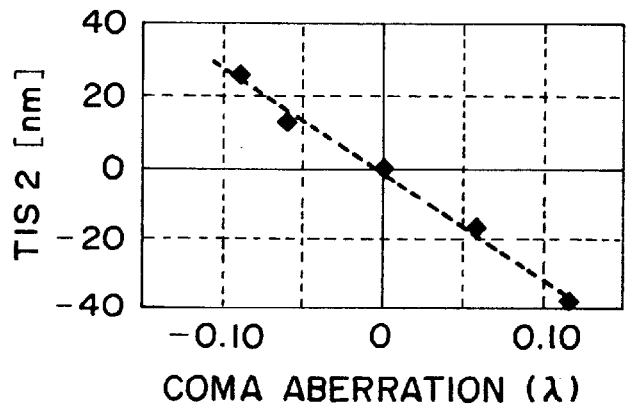
FIG. 1F is a schematic view for explaining changes in the two-mark interval measurement method $TIS_2$ as the coma aberration is changed.
Figure 1G:
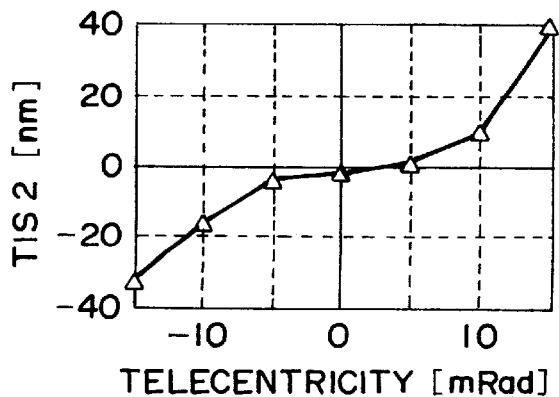
FIG. 1G is a schematic view for explaining changes in the two-mark interval measurement method $TIS_2$ as the perpendicularity of the illumination system is changed.
Figure 2:
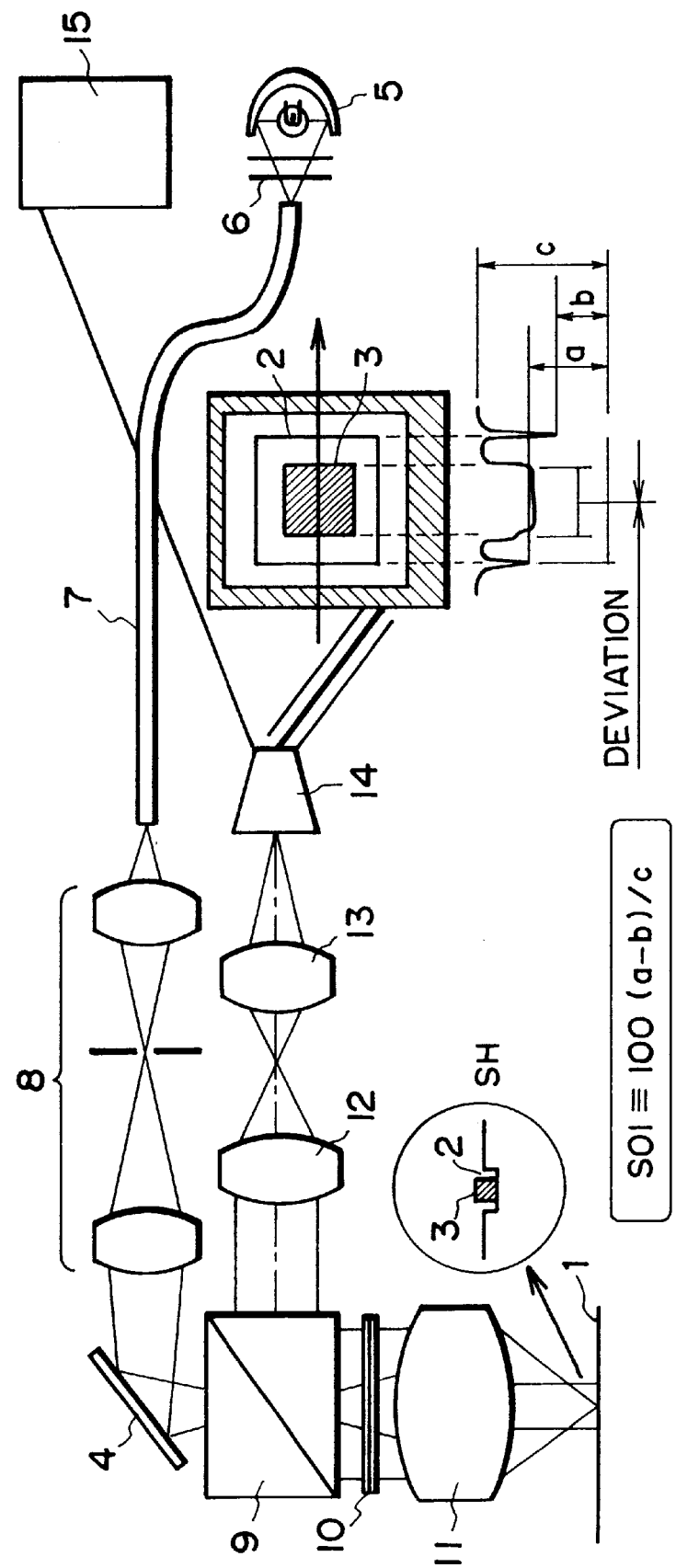
FIG. 2 is a schematic view of a main portion of a registration inspecting apparatus according to a first embodiment of the present invention.

FIG. 2 is a schematic view of a main portion of a registration inspecting apparatus according to an embodiment of the present invention. The outside general configuration of the inspecting apparatus is similar to that having been described with respect to the conventional examples, FIG. 2 is used again to describe an embodiment of the present invention.

Denoted in FIG 2 at 1 is a wafer which comprises a silicon etching wafer (first mark for registration) 2 on which a resist pattern (second mark for registration) 3 is formed.

A light beam 6 emitted from a halogen lamp 5 goes through a fiber 7, an illumination system 8 and a mirror 4, and then it passes through a polarization beam splitter 9, a quarter waveplate 10 and an objective lens 11, so that it is projected on the two marks 2 and 3. Reflection light from the marks 2 and 3 goes back along its oncoming path. That is, it goes through the objective lens 11 and the quarter waveplate 10. Then, the light is reflected by the polarization beam splitter 9, and it goes through a relay lens 12, such that, by an erector 13, the light is imaged on an image pickup surface of a CCD camera 14.

The images of the two masks 2 and 3 are photoelectrically converted by the camera 14, and corresponding signals are applied to a computer (operational means) 15 through a line. These signals are processed by the computer 15, whereby a relative positional relation between the two marks 2 and 3 is detected. The wafer 1 (optical member) is placed on a wafer chuck, not shown. The wafer chuck is mounted on a θ-Z stage (driving means), not shown, and it functions to attract the wafer 1 toward its top surface to thereby hold the wafer 1 position against a shift due to various vibrations.

The θ-Z stage is mounted on a tilt stage, not shown, and it functions to move the wafer 1 upwardly and downwardly along the focus direction (optical axis direction of the optical system). The elements denoted at 9–13 are components, constituting an imaging optical system.

In this embodiment, the pattern of the second mark is transferred onto the first mark 2, and the registration precision between the first and second marks is measured. Here, through the optical system, the first and second marks are imaged upon the photoelectric converting device and, on the basis of video signals produced, the registration precision between the first and second marks is measured.

For evaluation of the imaging performance of the above-described optical system, the pattern of the first mark is provided by a surface level difference (height of surface step) with which, in the wavelength region used for the illumination, the asymmetry curve shows a peak (where the asymmetry curve is produced while taking into account the weight of the intensity distribution of the illumination wavelength, the spectral transmission factor of the optical system, the spectrum-to-photoelectric conversion efficiency of the photoelectric converting device, and the spectral reflection factor of the first and second marks). The pattern of the second mark is provided by a surface level difference with which the asymmetry curve shows a peak but its asymmetry direction is opposite to that of the asymmetry peak of the pattern of the first mark. The focus is changed within the range of the optical depth (depth of focus) of the optical system, and the measurement of the registration precision between the first and second marks is performed once. Then, the first and second marks are rotated by 180 deg., and the measurement is performed once more. Then, a half of the difference between the two measurements at respective focus values is calculated. The resultant value is used for the evaluation of imaging performance. Thereafter, on the basis of the evaluation, the optical system is adjusted to remove the TIS.

Figure 3:
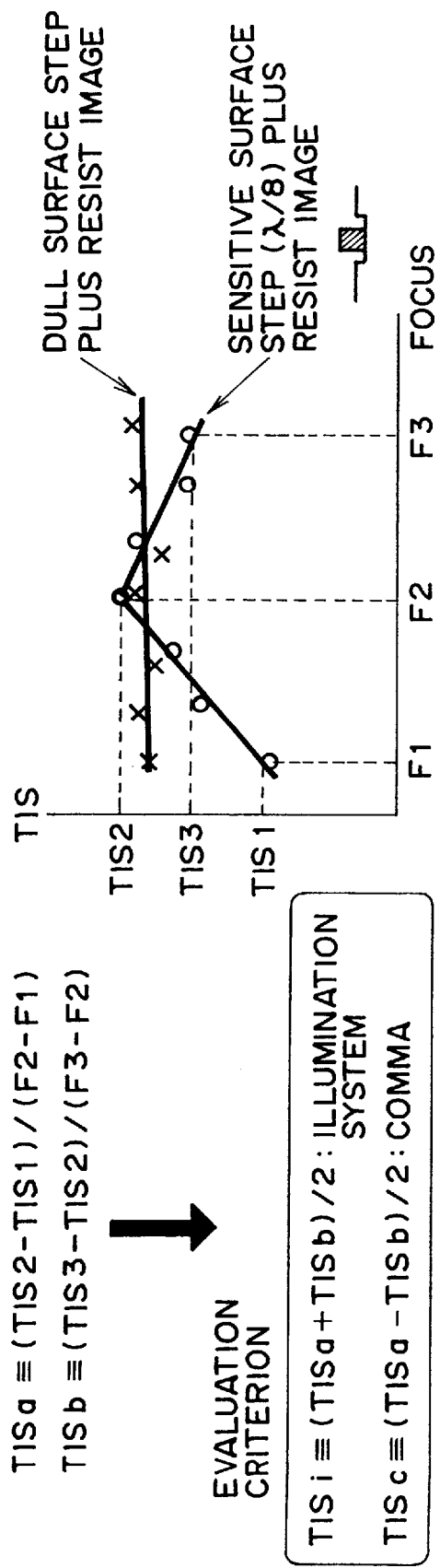
FIG. 3 is a schematic view for explaining a defocus TIS method, according to an imaging performance evaluation method of the present invention.

FIG. 3 is a schematic view for explaining the TIS-through-Focus process according to the imaging performance evaluation method of the present invention. FIG. 3 illustrates measurement of TIS while moving the wafer (optical member) in the focus direction (optical axis direction), and evaluation of coma aberration as well as uniformness of the illumination system, based on it.

Here, the coma aberration and the evaluation criterion for the illumination system are defined as TISc and TISi, as follows:

Coma Evaluation Criterion TISc=(TISa−TISb)/2

Illumination System Evaluation Criterion TISi=(TISa+TISb)/2 where

TISa=(TIS$_2$−TIS$_1$)/(F$_2$−F$_1$)

TISb=(TIS$_3$−TIS$_2$)/(F$_3$−F$_2$)

This evaluation method can be regarded as evaluation of the telecentricity of TIS. A telecentric system is an optical system wherein a pupil is at an infinite position and wherein a chief ray off the axis is parallel to the optical axis. Here, the word "telecentric" is used to refer to the perpendicularity of the detecting system with respect to the picture angle close to the axis.

The surface level difference to be used in the TIS-through-Focus method will be described. As for the surface level difference (height of surface step) of the mark to be used in the two-mark (first and second marks 2 and 3) interval measurement TIS$_2$ described hereinbefore, values corresponding to ⅛ and ⅜ with respect to the center wavelength $\lambda_c$ of the illumination wavelength used in the alignment optical system, that is, $\lambda_c/8$ and $3\lambda_c/8$, are used in this embodiment. Here, in order to meet the requirement of higher precision, an evaluation criterion taking into account many other variables is prepared. As regards such variables, there may be the intensity distribution of the illumination wavelength in the wavelength region used for the illumination, the spectral transmission factor of the optical system, the spectrum-to-photoelectric conversion efficiency of the photoelectric converting device, and the spectral reflection factor of the silicon wafer (first mark) and the resist pattern (second mark), for example.

Figure 4:
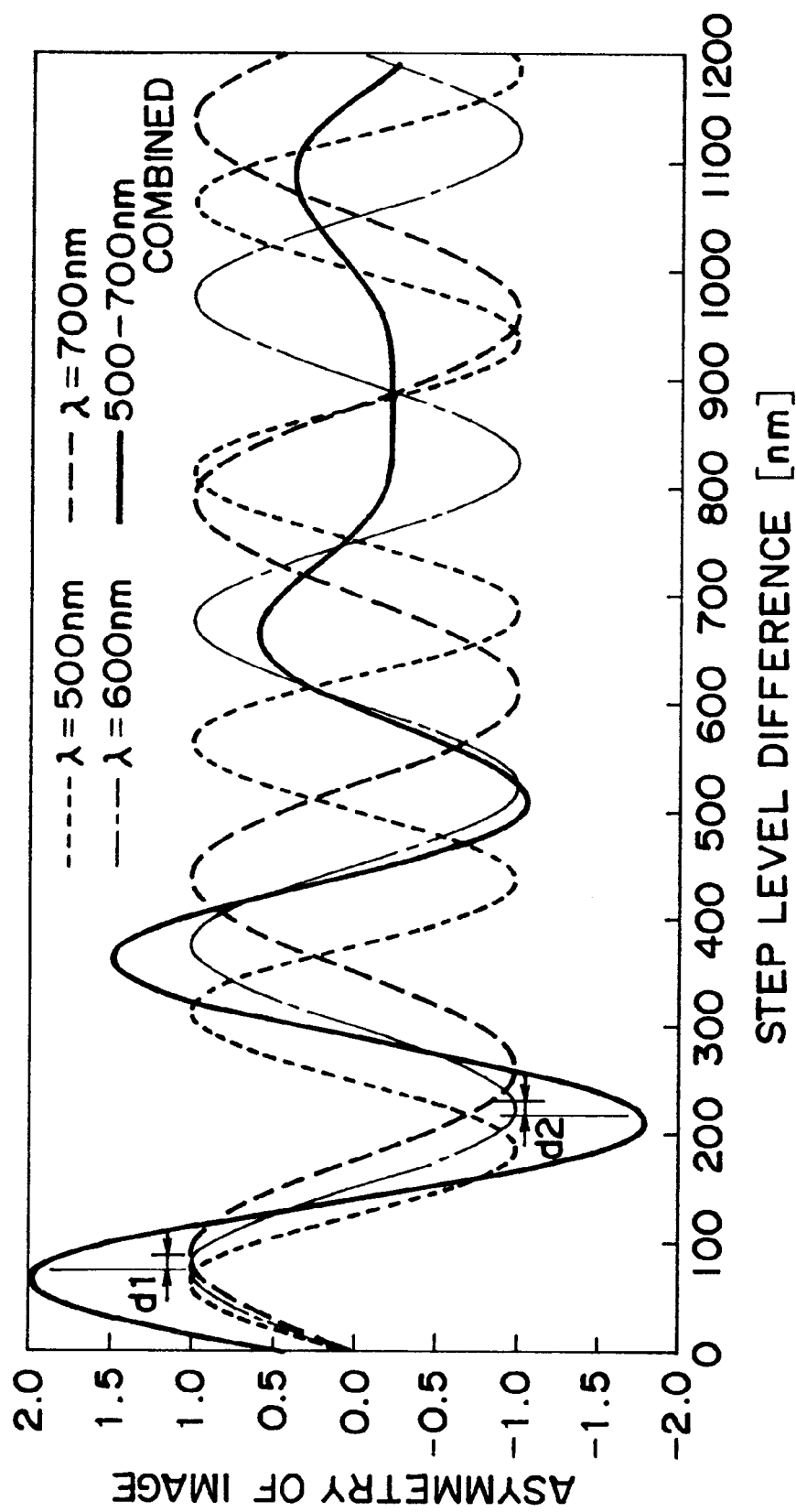
FIG. 4 is a graph showing the surface level difference and the asymmetry of an image, as well as composite symmetry curves in a case of a constant intensity distribution in a wavelength range from 500 nm to 700 nm.

The principle of the imaging performance evaluation method in this embodiment of the present invention will be described with respect to a simplest case, in conjunction with FIG. 4. In FIG. 4, a case where the illumination light has a constant or even intensity distribution in the wavelength range from 500 nm to 700 nm, will be described.

Such an even intensity distribution is provided not solely by the light source but it is determined totally while taking into account the light source, the fiber, the illumination optical system, the reflection factor of the wafer, the transmission factor of the imaging optical system, and the spectral sensitivity of the image pickup device.

FIG. 4 illustrates what can be called an "asymmetry curve" wherein the axis of the abscissa denotes the surface step level difference of the mark, and the axis of the ordinate shows the asymmetry of the image. With respect to the wavelengths 500 nm, 600 nm and 700 nm, the asymmetry varies as a sine function of the period which is a half of the corresponding wavelength. Here, it is assumed that the illumination light used have an even intensity distribution from 500 nm to 700 nm in wavelength.

The asymmetry of the image in the above-described case is such that the asymmetries from 500 nm to 700 nm in wavelength are accumulated into a composite asymmetry. In practical measurement, such composite asymmetry has an influence. The curve of such composite asymmetry is illustrated as a combined asymmetry curve in FIG. 4. The surface level difference at the peak in the composite asymmetry curve is deviated from ⅛ (75 nm) of the center wavelength $\lambda_c$ (=600 nm) of the illumination wavelength width which corresponds to the surface level difference as used in the two-mask interval measurement method TIS$_2$. Also, it is deviated from ⅜ (225 nm) of the center wavelength $\lambda_c$ (=600 nm) of the illumination wavelength width.

In this embodiment, a most sensitive surface level difference under the condition of practical use is used. Namely, the surface level difference of the peak of the combined symmetry curve shown in FIG. 4 is used. Since FIG. 4 is a simple example wherein the illumination light has an even intensity distribution from 500 nm to 700 nm in wavelength, the deviation from those described with reference to the two-mark interval measurement method is small. When practical conditions are included, the deviation will become larger.

Further, because the silicon wafer and the resist have different spectral reflection factors, they have different composite asymmetry curves. In this embodiment, the silicon wafer is set to the step level difference of the first peak in the composite asymmetry curve of FIG. 4, while the resist thickness is set to the surface level difference of the second peak in the composite asymmetry curve (the peak is in a direction different from that of the asymmetry of the surface step of the silicon wafer). The above-described procedure thus enables use of surface level differences which most reflect the coma and the non-uniformness of the illumination system, in a strict sense, i.e., taking into account many variables (such as the intensity distribution of the illumination wavelength in the wavelength region used for the illumination, the spectral transmission factor of the optical system, the spectrum-to-photoelectric conversion efficiency of the photoelectric converting device, and the spectral reflection factor fo the silicon wafer and the resist pattern).

FIG. 3 illustrates the results of measurement based on the TIS-through-Focus process using a sensitive surface level difference and also a dull or non-sensitive surface level difference. In the case of a sensitive surface level difference, the linearity changes about the focus $F_2$ position due to the influence of coma. On the other hand, in the case of a dull surface level difference, the TIS-through-Focus shows substantially no change.

Figure 5:
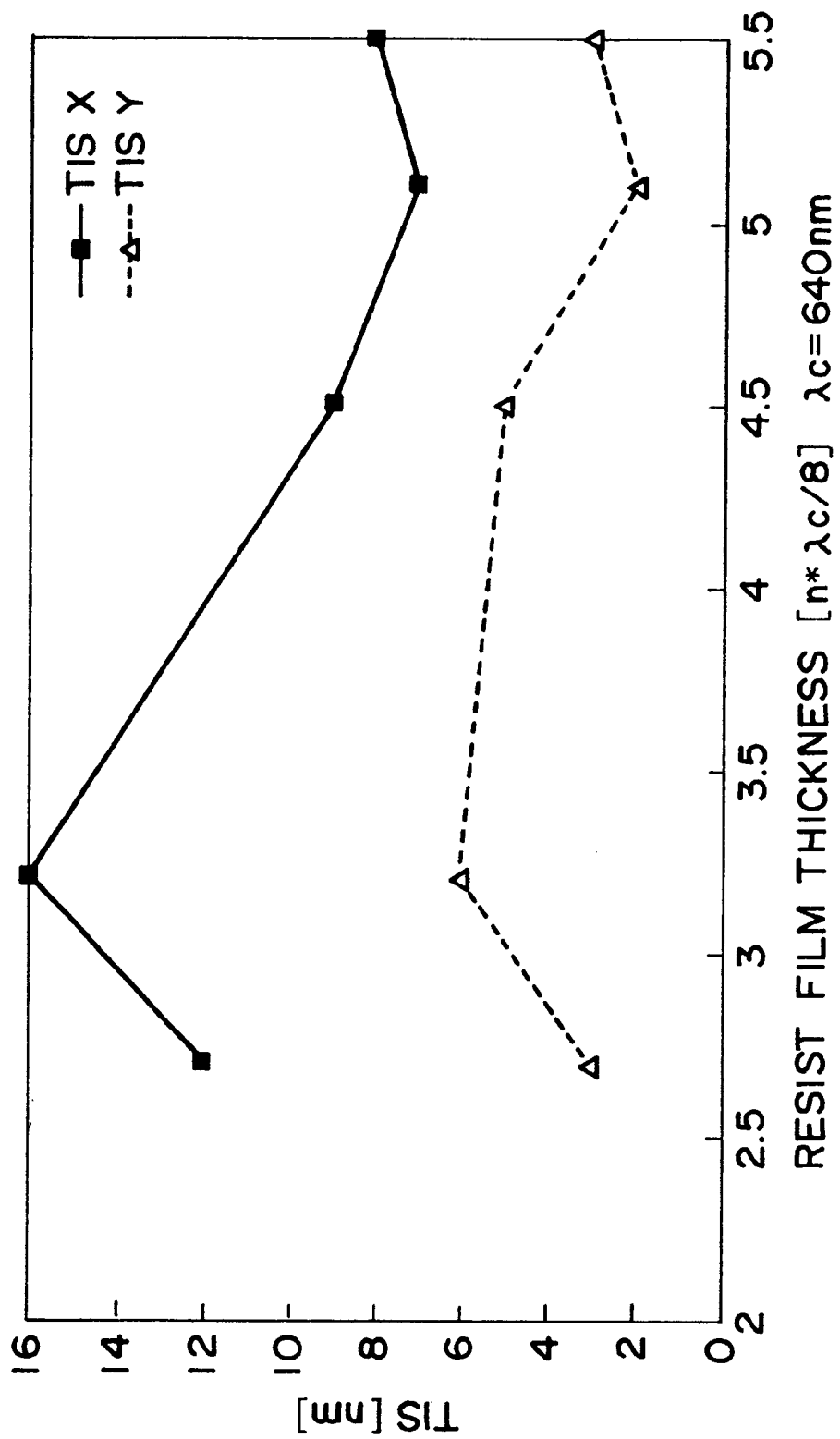
FIG. 5 is a graph showing changes in TIS with a varying resist thickness, when TIS is measured with the use of a silicon wafer and a resist pattern.

Next, the resist thickness will be described. As regards the resist thickness, it has been found by experiments that the sensitivity is determined essentially by the thickness thereof and that it does not depend on the refractive index of the resist. FIG. 5 is a graph showing the TIS with varying resist thickness when the silicon wafer (first mark 2) and the resist pattern (second mark 3) are used for measurement of the TIS.

The surface level difference of the silicon wafer corresponds to that of the first mark of the composite asymmetry curve of this embodiment. When TIS is detected while changing the resist thickness sequentially, each time by about $\lambda_c/8$, a maximum TIS appears in the vicinity of $3\lambda_c/8$ (more exactly, at the second peak in the composite asymmetry curve under the condition of the resist), and a minimum TIS appears in the vicinity of $5\lambda_c/8$ (more exactly, at the third peak of the composite asymmetry curve under the condition of the resist).

This is because: in the vicinity of the resist thickness $3\lambda_c/8$, the symmetry in terms of the composite asymmetry curve described above is in the opposite direction as the surface level difference of the silicon wafer, such that TIS becomes largest. In the vicinity of the resist thickness $5\lambda_c/8$, the direction of asymmetry of the surface level difference of the silicon wafer lies in the same direction, such that TIS becomes smallest.

Figure 6:
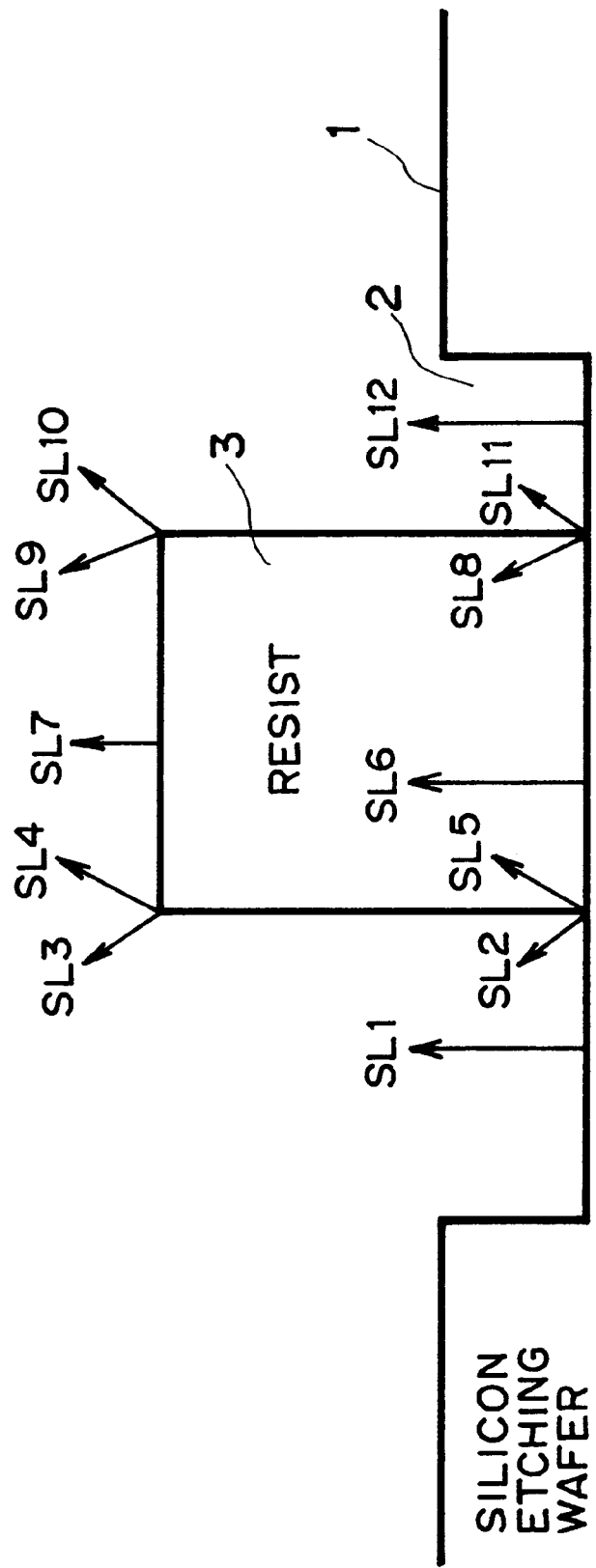
FIG. 6 is a schematic view for explaining the action of light rays at the boundary between a silicon wafer and a resist pattern.

FIG. 6 illustrates the action of the light rays at the boundary between a silicon and a resist pattern. The wavelength region generally used as the wavelength of illumination in a registration inspecting apparatus is from 500 nm to 700 nm in wavelength. With respect to such wavelengths, a resist is a material having a transmissivity.

As a result, due to interference between the scattered light SL3 (SL4) and SL9 (SL10) from the top of a resist and the scattered light SL2 (SL5) and SL8 (SL11) from the bottom of the resist, and due to interference among the reflected light SL1 and SL12 from the silicon, the reflected light SL7 from the top face of the resist and the reflected light SL6 from the bottom of the resist, the optical image at the boundary between the silicon and the resist is affected.

According to the results of experiments (FIG. 5), when the thickness of the resist is d and the refractive index of the resist is N, the quantity of it is determined mainly by the space region of the interference (i.e., not by the scattered light SL5 and SL8 within the resist) between the scattered light SL3 (SL4) and SL9 (SL10) from the top of the resist and the scattered light SL2 and SL11 from the bottom of the resist. Thus, it depends on the resist thickness d.

While the present invention has been described above with reference to a registration inspecting apparatus for which a highest precision is required in the manufacture of semiconductor devices, the invention is not limited to it.

The present invention is applicable to any systems in which an image is formed through an optical system. For example, it may be applied to an alignment optical system in a semiconductor device manufacturing exposure apparatus, or it may be applied to an optical microscope for eye observation, with similar advantageous results.

In accordance with the embodiments of the present invention as described hereinbefore, even if a wafer has a WIS (being asymmetric with respect to the mark), the TIS can be removed by performing high precision evaluation of the coma aberration (including eccentric coma) and the uniformness of an illumination system which are optical factors of TIS in a registration inspecting apparatus and then by correcting the same, such that the TIS-WIS interaction can be prevented. As a result, high precision mark measurement can be accomplished.

Further, since there is no TIS remaining, the TIS correction becomes unnecessary. The double measurements at 0-deg. and 180-deg. in the TIS correction method are unnecessary (only a single measurement is necessary), and therefore the time required for the detection can be reduced to a half. This enables an improvement of the throughput.

While the invention has been described with reference to the structures disclosed herein, it is not confined to the details set forth and this application is intended to cover such modifications or changes as may come within the purposes of the improvements or the scope of the following claims.

What is claimed is:

1. A method of evaluating an imaging performance of an imaging optical system, said method comprising the steps of:

providing a member having a measurement mark with a predetermined surface level difference;

illuminating the member having the measurement mark through the imaging optical system, and receiving reflection light from the illuminated measurement mark again through the imaging optical system;

producing a detection signal based on the measurement mark, illuminated through the imaging optical system, wherein the detection signal is produced while changing a focus within a depth of focus of the imaging optical system;

measuring a positional deviation on the basis of the detection signal; and evaluating the imaging performance of the imaging optical system on the basis of a change in a measured value of the positional deviation measurement with respect to a change in the focus.

2. A method according to claim 1, wherein the surface level difference on a substrate of the measurement mark corresponds to a peak of an asymmetry curve of an output value of a detection signal obtainable from the measurement mark.

3. A method according to claim 1, wherein the measurement mark includes a first mark provided on a substrate beforehand and a second mark transferred in relation to the first mark, wherein the measurement of positional deviation is performed to measure a registration precision between the first and second marks, wherein the first mark is defined by a surface level difference with which an asymmetry curve of a detection signal obtainable from the first mark shows a peak, and wherein a pattern of the second mark is defined by a surface level difference with which an asymmetry curve of a detection signal obtainable from the second mark shows a peak and also an asymmetry direction of which is opposite to the asymmetry peak to be provided by the pattern of the first mark.

4. A method according to claim 3, wherein the first mark and the second mark of the measurement mark are provided on the member by a surface level difference with which, in terms of a wavelength region to be used for illumination, an asymmetry curve, to be defined while taking into account an intensity distribution of an illumination wavelength, a spectral transmission factor of an illumination optical system, a spectrum-to-photoelectric conversion efficiency of a photoelectric converting element, and a spectral reflection factor of an object, constituting the first and second marks, shows a peak.

5. A method according to claim 3, wherein the positional deviation measurement to the first and second marks is performed again while rotating the first and second marks by 180 degrees from a predetermined position, wherein a half of a sum of measured values of the two measurements at respective focus values is calculated, and wherein the evaluation of imaging performance is executed on the basis of the result of the calculation.

6. A method according to claim 3, wherein the first mark comprises a silicon etching pattern while the second mark comprises a resist pattern.

7. A method of adjusting an imaging optical system, comprising the steps of:

providing a member having a measurement mark with a predetermined surface level difference;

illuminating the member having the measurement mark through the imaging optical system, and receiving reflection light from the illuminated measurement mark again through the imaging optical system;

producing a detection signal based on the measurement mark, illuminated through the imaging optical system, wherein the detection signal is produced while changing a focus within a depth of focus of the imaging optical system;

measuring a positional deviation on the basis of the detection signal; and adjusting the imaging optical system on the basis of a result of the positional deviation measurement.

8. A measuring system for measuring imaging performance of an imaging optical system, said system comprising:

a detecting system for producing, through the imaging optical system, a detection signal in relation to a member having a measurement mark with a predetermined surface level difference, and on the basis of the measurement mark, wherein (i) for producing the detection signal, the member having the measurement mark is illuminated through the imaging optical system and reflection light from the illuminated measurement mark is received again through the imaging optical system, and (ii) the detection signal is produced while changing a focus within a depth of focus of the imaging optical system; and a processing system for performing measurement of a positional deviation on the basis of the detection signal, wherein the imaging performance of the imaging optical system is evaluated on the basis of a change in a measured value of the positional deviation measurement with respect to a change in the focus.

9. An apparatus for transferring a pattern of an original onto a workpiece, said apparatus comprising:

a detecting system for producing, through an imaging optical system, a detection signal in relation to a member having a measurement mark with a predetermined surface level difference, and on the basis of the measurement mark, wherein (i) for producing the detection signal, the member having the measurement mark is illuminated through the imaging optical system and reflection light from the illuminated measurement mark is received again through the imaging optical system, and (ii) the detection signal is produced while changing a focus within a depth of focus of the imaging optical system; and a processing system for performing measurement of a positional deviation on the basis of the detection signal, wherein the imaging performance of the imaging optical system is evaluated on the basis of a change in a measured value of the positional deviation measurement with respect to a change in the focus.

* * * * *